United States Patent
Mauder et al.

(10) Patent No.: US 10,615,254 B2
(45) Date of Patent: Apr. 7, 2020

(54) SEMICONDUCTOR DEVICE INCLUDING A SUPER JUNCTION STRUCTURE IN A SIC SEMICONDUCTOR BODY

(71) Applicant: Infineon Technologies AG, Neubiberg (DE)

(72) Inventors: Anton Mauder, Kolbermoor (DE); Rudolf Elpelt, Erlangen (DE); Dethard Peters, Hoechstadt (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/169,671

(22) Filed: Oct. 24, 2018

(65) Prior Publication Data

US 2019/0067416 A1   Feb. 28, 2019

Related U.S. Application Data

(63) Continuation of application No. 15/649,870, filed on Jul. 14, 2017, now Pat. No. 10,115,791.

(30) Foreign Application Priority Data

Jul. 15, 2016  (DE) .................. 10 2016 113 129

(51) Int. Cl.
*H01L 29/66* (2006.01)
*H01L 29/06* (2006.01)
(Continued)

(52) U.S. Cl.
CPC ...... *H01L 29/0649* (2013.01); *H01L 29/0619* (2013.01); *H01L 29/0634* (2013.01);
(Continued)

(58) Field of Classification Search
CPC ............. H01L 29/0649; H01L 29/0619; H01L 29/0634; H01L 29/1608; H01L 29/4236;
(Continued)

(56) References Cited

U.S. PATENT DOCUMENTS 8,178,920 B2   5/2012  Nakamura et al.
8,765,557 B2   7/2014  Hayashi et al.
(Continued)

FOREIGN PATENT DOCUMENTS

WO   2014112233 A1   7/2014
WO   2015013620 A1   1/2015

OTHER PUBLICATIONS

Kosugi, Ryoji, et al., "First experimental demonstration of SiC super-junction (SJ) structure by multi-epitaxial growth method", Proceedings of the 26th International Symposium on Power Semiconductor Devices & IC's, Jun. 2014, Waikoloa, Hawaii, pp. 346-349.

*Primary Examiner* — Tu-Tu V Ho
(74) *Attorney, Agent, or Firm* — Murphy, Bilak & Homiller, PLLC

(57) ABSTRACT

An embodiment of a semiconductor device includes a SiC semiconductor body region having a body region of a first conductivity type, a drift zone of a second conductivity type, and a compensation structure of the first conductivity type. The compensation structure and a drift zone section of the drift zone form a super junction structure. The compensation structure adjoins the body region and is positioned entirely below the body region in a vertical direction perpendicular to a surface of the SiC semiconductor body. The compensation structure includes a first compensation sub-structure and a second compensation sub-structure. The first compensation sub-structure and the second compensation sub-structure are arranged above one another in the vertical direction. A width of the compensation structure changes along the vertical direction.

15 Claims, 6 Drawing Sheets

(51) Int. Cl.
  *H01L 29/78* (2006.01)
  *H01L 29/16* (2006.01)
  *H01L 29/423* (2006.01)
  *H01L 29/10* (2006.01)

(52) U.S. Cl.
  CPC ...... *H01L 29/1608* (2013.01); *H01L 29/4236* (2013.01); *H01L 29/4238* (2013.01); *H01L 29/42368* (2013.01); *H01L 29/66068* (2013.01); *H01L 29/7802* (2013.01); *H01L 29/7813* (2013.01); *H01L 29/1095* (2013.01)

(58) Field of Classification Search
  CPC ........... H01L 29/42368; H01L 29/4238; H01L 29/66068; H01L 29/7802; H01L 29/7813; H01L 29/1095
  USPC ....................................................... 257/330
  See application file for complete search history.

(56) References Cited

U.S. PATENT DOCUMENTS

| | | |
|---|---|---|
| 8,941,121 B2 | 1/2015 | Hayashi et al. |
| 2009/0267141 A1 | 10/2009 | Matocha et al. |
| 2013/0264582 A1 | 10/2013 | Hayashi |
| 2014/0231903 A1* | 8/2014 | Willmeroth ......... H01L 29/0634 257/330 |
| 2014/0231912 A1 | 8/2014 | Willmeroth et al. |
| 2015/0115286 A1 | 4/2015 | Takeuchi et al. |

\* cited by examiner

SEMICONDUCTOR DEVICE INCLUDING A SUPER JUNCTION STRUCTURE IN A SIC SEMICONDUCTOR BODY

BACKGROUND

Semiconductor devices known as charge compensation or super junction (SJ) semiconductor devices, for example SJ insulated gate field effect transistors (SJ IGFETs) are based on mutual space charge compensation of n- and p-doped regions in a semiconductor substrate or body allowing for an improved trade-off between area-specific on-state resistance Ron×A and breakdown voltage Vbr between load terminals such as source and drain. Performance of charge compensation of SJ semiconductor devices depends on a lateral or horizontal charge balance between the n-doped and p-doped regions. A typical application field of high-voltage SJ IGFETs capable of blocking voltages greater than 1000V or greater than 1500V relates to motor drives. Since motor windings are stacked on each other, voltage ramps at the motor terminal or the motor windings have to be limited. Typical voltage ramps during switching modes are in a range of several kV/µs. When the voltage ramps become too high for the motor, the voltage increase between winding strands becomes too high and may cause ageing of the isolation, for example by partial discharge that may lead to an early failure of the motor. Further failures may be caused by high capacitive currents flowing from the motor windings through the rotor and the bearing to ground. These high capacitive currents may also cause ageing of the bearing that may lead to an early failure of the motor.

It is desirable to improve a switching characteristic of a super junction semiconductor device.

SUMMARY

The present disclosure relates to an embodiment of a semiconductor device. The semiconductor device includes a body region of a first conductivity type in a SiC semiconductor body of a second conductivity type. The semiconductor device further includes a super junction structure in the SiC semiconductor body, and includes a drift zone section being of the second conductivity type and a compensation structure of the first conductivity type. The compensation structure adjoins the body region and includes compensation sub-structures consecutively arranged along a vertical direction perpendicular to a surface of the SiC semiconductor body. The compensation sub-structures include a first compensation sub-structure and a second compensation sub-structure. A resistance of the second compensation sub-structure between opposite ends of the second compensation sub-structure along the vertical direction is at least five times larger than a resistance of the first compensation sub-structure between opposite ends of the first compensation sub-structure along the vertical direction.

The present disclosure relates to another embodiment of a semiconductor device. The semiconductor device includes a body region of a first conductivity type in a SiC semiconductor body of a second conductivity type. The semiconductor device further includes a super junction structure in the SiC semiconductor body, and includes a drift zone section being of the second conductivity type and a compensation structure of the first conductivity type. The compensation structure adjoins the body region and includes compensation sub-structures consecutively arranged along a vertical direction perpendicular to a surface of the SiC semiconductor body. The compensation sub-structures include a first compensation sub-structure and a second compensation sub-structure. An average doping concentration along a vertical extension of the first compensation sub-structure is at least five times larger than an average doping concentration along a vertical extension of the second compensation sub-structure.

The present disclosure relates to yet another embodiment of a semiconductor device. The semiconductor device includes a body region of a first conductivity type in a SiC semiconductor body of a second conductivity type. The semiconductor device further includes a super junction structure is in the SiC semiconductor body, and includes a drift zone section being of the second conductivity type and a compensation structure of the first conductivity type. The compensation structure adjoins the body region and includes compensation sub-structures consecutively arranged along a vertical direction perpendicular to a surface of the SiC semiconductor body. The compensation sub-structures include a first compensation sub-structure and a second compensation sub-structure. A width of the first compensation sub-structure is at least five times larger than a width of the second compensation sub-structure.

The present disclosure relates to yet another embodiment of a semiconductor device. The semiconductor device includes a body region of a first conductivity type in a SiC semiconductor body of a second conductivity type. The semiconductor device further includes a super junction structure is in the SiC semiconductor body, and includes a drift zone section being of the second conductivity type and a compensation structure of the first conductivity type. The compensation structure adjoins the body region and includes compensation sub-structures consecutively arranged along a vertical direction perpendicular to a surface of the SiC semiconductor body. The compensation sub-structures include a first compensation sub-structure and a second compensation sub-structure. The first compensation sub-structure includes a plurality of elongated first semiconductor regions extending in parallel along a first lateral direction. The second compensation sub-structure includes a plurality of second semiconductor regions spaced apart from one another along the first lateral direction.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

DETAILED DESCRIPTION

Figure 1A:
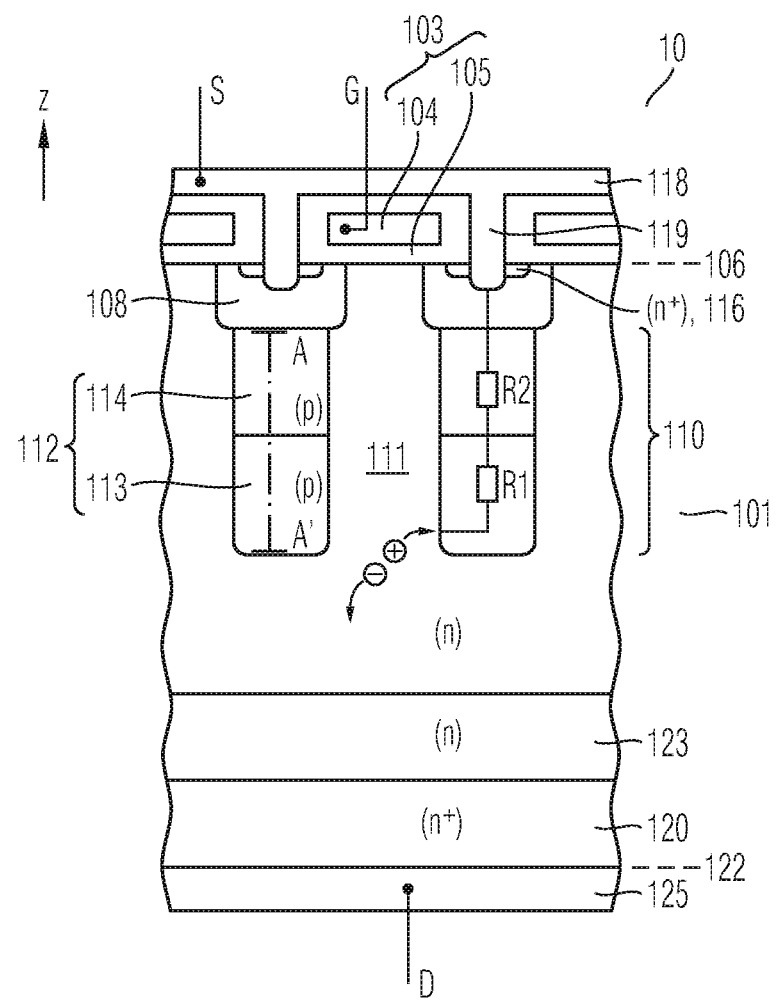
FIG. 1A is a schematic cross-sectional view of an embodiment of a vertical SiC super junction semiconductor device including a planar gate structure.
Figure 1A:
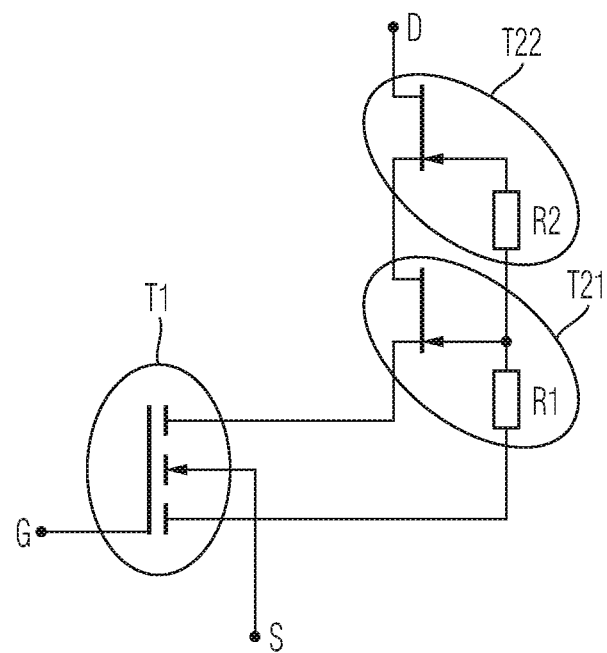

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another In this specification, a drift zone and further regions are described as being n-doped while a body region and other regions are described to be p-doped. Alternatively, the semiconductor devices can be formed with opposite doping relations so that the drift zone can be p-doped and the body region can be n-doped.

Processing of a semiconductor wafer may result in semiconductor devices having terminal contacts such as contact pads (or electrodes) which allow electrical contact to be made with the integrated circuits or discrete semiconductor devices included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Al, Cu, Ni, Sn, Ti, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the semiconductor wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above-mentioned techniques, and pull the tape, e.g., along four orthogonal directions in the plane of the tape. By pulling the tape, the semiconductor wafer gets divided into a plurality of semiconductor dies (chips).

Referring to the schematic cross-sectional view of an n-doped SiC semiconductor body 101 illustrated in FIG. 1A, an embodiment of a vertical SiC super junction semiconductor device includes a planar gate structure 103. The planar gate structure 103 includes a gate electrode 104 and a dielectric 105 electrically isolating the gate electrode 104 and SiC semiconductor body 101. The planar gate structure 103 is arranged on or above a first surface 106 of the SiC semiconductor body 101.

The vertical SiC super junction semiconductor device 10 further includes a p-doped body region 108 in the n-doped SiC semiconductor body 101.

A super junction structure 110 in the n-doped SiC semiconductor body 101 includes an n-doped drift zone section 111 and a p-doped compensation structure 112. The n-doped drift zone section 111 may constitute a part of the SiC semiconductor body 101. The compensation structure 112 adjoins the p-doped body region 108 and includes compensation sub-structures consecutively arranged along a vertical direction z perpendicular to the first surface 106 of the SiC semiconductor body 101. The compensation sub-structures include a first compensation sub-structure 113 and a second compensation sub-structure 114. A resistance R2 of the second compensation sub-structure 114 between opposite ends of the second compensation sub-structure along the vertical direction is at least five times, or at least seven times, or even at least ten times larger than a resistance of the first compensation sub-structure between opposite ends of the first compensation sub-structure along the vertical direction.

In some embodiments, the arrangement of the first and second semiconductor sub-structures 113, 114 is opposite to the illustration of FIG. 1A, i.e. the first semiconductor sub-structure 113 is closer to the body region 108 than the second semiconductor sub-structure 114.

The vertical SiC super junction semiconductor device 10 further includes an $n^+$-doped source region 116 at the first surface 106. The $n^+$-doped source region 116 and the p-doped body region 108 are electrically coupled to a source terminal S including a source metallization 118 via a contact 119. The contact 119 may be a plug and/or a line and may be formed as part of the source metallization 118 or by a material different from the material of the source metallization 118. In the embodiment illustrated in FIG. 1A the contact 119 is a contact groove extending into the SiC semiconductor body 101 and providing electric contact to the $n^+$-doped source region 116 and the p-doped body region 108 via sidewalls and a bottom side of the contact groove, respectively. An optional $p^+$-doped body contact region may be sandwiched between the body region 108 and the bottom side of the contact 119 for improving an ohmic contact characteristic. The contact 119 may also end at the first surface 106 and provide electric contact to the $n^+$-doped source region 116 and the p-doped body region 108 via a contact scheme through the first surface 106. A variety of contact schemes for contacting the $n^+$-doped source region 116 and the p-doped body region 108 exist. By way of example, contact areas for contacting the $n^+$-doped source region 116 and the p-doped body region 108 may alternate along a direction perpendicular to the drawing plane of FIG. 1A.

The vertical SiC super junction semiconductor device 10 further includes an $n^+$-doped drain region 120 at a second surface 122 of the SiC semiconductor body 101. An optional n-doped pedestal region 123 may be sandwiched between the drain region 120 and the super junction structure 110. In the embodiment illustrated in FIG. 1A, the optional pedestal region 123 is spaced from the super junction structure 110.

In some other embodiments, the optional pedestal region 123 may also reach or extend into the super junction structure 110. The optional pedestal region includes one or more pedestal sub-regions. The one or more pedestal sub-regions typically include a lower n-doping concentration than the $n^+$-doped drain region 120. A doping profile of the one or more pedestal sub-regions may be set depending on the a doping level of the n-doped drift zone section 111 for the purpose of stopping and/or allowing a further extension of a space charge region from the super junction structure 110 toward the drain region 120 in a blocking mode of the vertical SiC super junction semiconductor device 10.

The $n^+$-doped drain region 120 is electrically coupled to a drain terminal D including a drain metallization 125. Load current flows in the vertical SiC super junction semiconductor device 10 along a vertical direction between the load terminals at the first and second surfaces 106, 122, respectively. A schematic equivalent circuit of the vertical SiC super junction semiconductor device 10 is illustrated in the bottom part of FIG. 1A and includes an n-type field effect transistor (n-type FET) T1 controlled via the gate terminal G in FIG. 1A as well as n-type junction field effect transistors (n-type JFETs) T21, T22. A conducting channel of the n-type JFETs T21, T22 is given by the n-doped drift zone section 111 sandwiched between neighboring parts of the compensation structure 112. Constriction of the conducting channel is accomplished using the field effect when a blocking voltage between the drain terminal D and the source terminal S causes the super junction structure 110 to become depleted of free charge carriers resulting in a lateral extension of a space charge region between the drift zone section 111 and the compensation structure 112. When the super junction structure 110 is depleted of electrons and holes, the holes are conducted through the p-doped compensation structure 112 to the source terminal S, and the electrons are conducted through the drift zone section 111, the optional pedestal region 123, and the drain region 120 to the drain terminal D. A voltage drop caused by a hole current over the resistances R1, R2 causes a pinch-off of the JFETs T21, T22 to occur at the super junction structure 110.

Figure 1B:
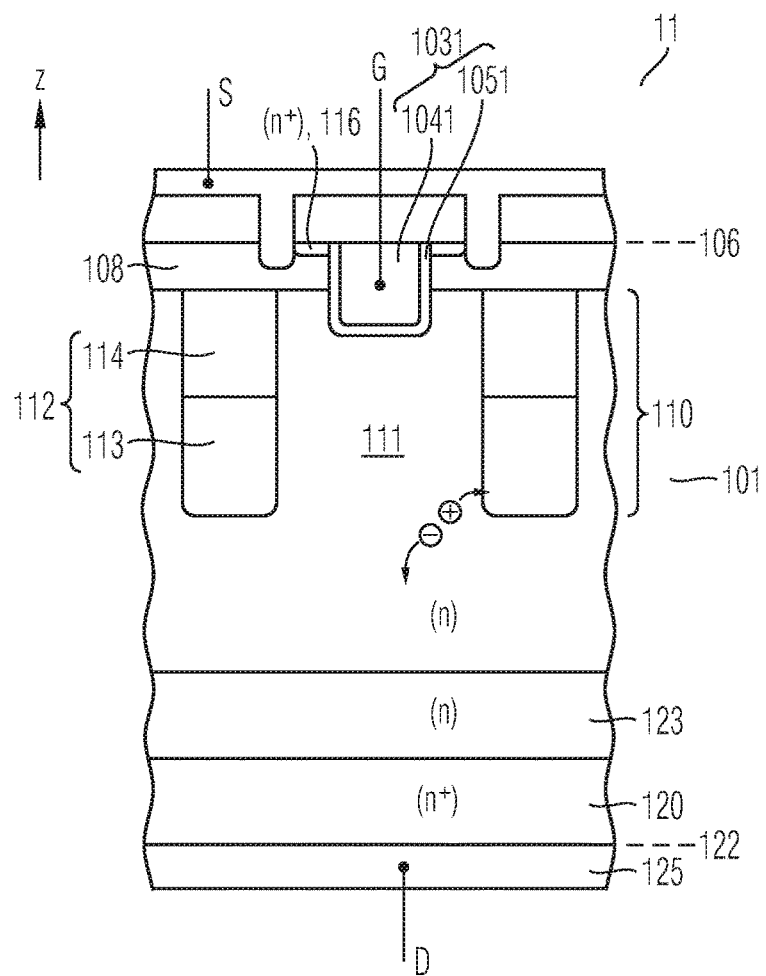
FIG. 1B is a schematic cross-sectional view of an embodiment of a vertical SiC super junction semiconductor device including a trench gate structure.

The gate structure of the vertical SiC super junction semiconductor device may be varied. Referring to FIG. 1B, a schematic cross-sectional view of an embodiment of a vertical SiC super junction semiconductor device 11 including a trench gate structure 1031 is shown. The trench gate structure 1031 includes a trench gate electrode 1041 and a trench dielectric 1051 electrically isolating the trench gate electrode 1041 and the SiC semiconductor body 101. The trench gate structure 1031 is arranged in a trench 126 extending into the n-doped SiC semiconductor body 101 from the first surface 106. Further details provided above with respect to the embodiment illustrated in FIG. 1A apply accordingly.

The embodiments illustrated in FIGS. 1A and 1B and described above allow to achieve or come close to a resistive-type switching characteristic by controlling both current and voltage ramps. When turning the device on, an intermediate circuit voltage drops between the drain and source terminals D, S while a current increases from zero to a load current before the drain-to-source voltage drops to an on-state voltage of the device at constant load current. The characteristic may be achieved in the vertical SiC super junction semiconductor devices 10, 11 by interconnecting the JFET T2 and the IGFET T1 via resistances R1, R2 as is illustrated in FIG. 1A. In the SiC semiconductor body 101, depleting the p-doped compensation structure 112 of holes for building up a blocking voltage by a space charge region is limited by the resistances R1, R2. The conductivity of the p-doped compensation structure 112 in SiC is comparatively low due to deep acceptor levels in SiC. With increasing temperature, also a conductivity of the p-doped compensation structure 112 may be increased. The temperature characteristic of the conductivity in the p-doped compensation structure 112 may be used to configure the thermal behavior of the switch. The switch may be configured to reach target voltage ramps dU/dt at typical operation temperatures, for example temperatures in a range from 80° C. to 120° C. or at maximum rated temperatures, for example temperatures in a range from 125° C. to 200° C. When driving the switch into overload, for example during overcurrent operation or short circuit, the temperature increases, and consequently the switching speed increases, thereby reducing switching losses. This allows for counter-acting thermal runaway phenomena.

In some embodiments, the vertical SiC super junction semiconductor devices 10, 11 include a drain-to-source blocking voltage capability of more than 1000 V. By way of example, the voltage blocking capability may be adjusted by, inter alia, setting a vertical extension of the super junction structure 110. The vertical extension may be increased by increasing a number of layers stacked when manufacturing the super junction structure 110 by the multi-epitaxial growth technique, for example.

Although the vertical SiC super junction semiconductor devices 10, 11 are illustrated by way of two compensation sub-structures arranged one after another along the vertical direction z, i.e. the first and second compensation sub-structures 113, 114, more than two compensation sub-structures may be consecutively arranged along the vertical direction, for example depending on blocking voltage requirements of the SiC super junction semiconductor device.

In some embodiments, the first and second compensation sub-structures 113, 114 are alternately arranged along the vertical direction. In some other embodiments, a width of the compensation sub-structures consecutively arranged along the vertical direction z decreases along the vertical direction from a bottom side of the compensation structure 112 to the body region 108 at the first surface 106.

In some embodiments, the first and second compensation sub-structures 113, 114 overlap.

In some embodiments, a doping concentration profile of the first compensation sub-structure includes, between opposite ends of the first compensation sub-structure along the vertical direction, a plurality of first maxima.

In some embodiments, a doping concentration profile of the second compensation sub-structure includes, between opposite ends of the second compensation sub-structure along the vertical direction, a plurality of second maxima.

Figure 2:
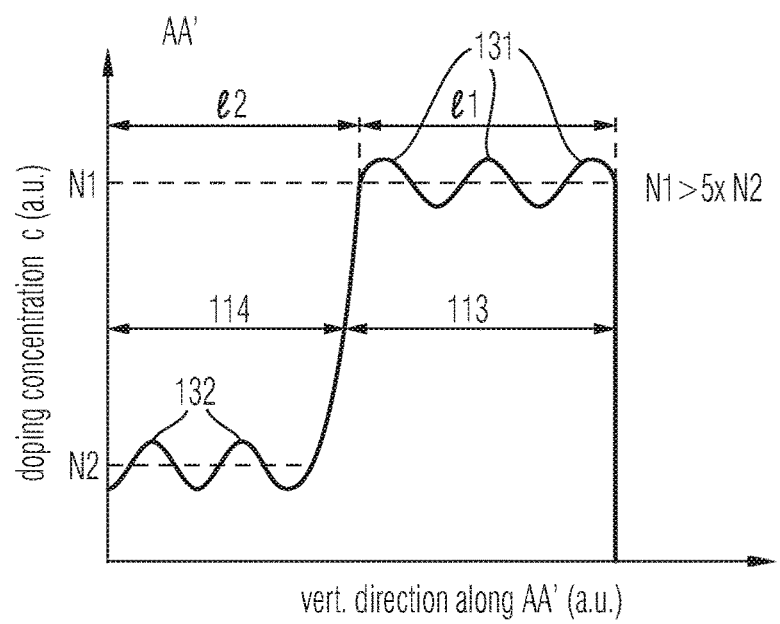
FIG. 2 is a schematic illustration of an example of a doping concentration profile of first and second compensation sub-structures along a line AA' of FIG. 1A.

FIG. 2 is a schematic illustration of an example of the first and second compensation sub-structures 113, 114 along a line AA' of FIG. 1A. In the graph illustrated in FIG. 2, the first compensation sub-structure 113 includes a plurality of first maxima 131, and the second compensation sub-structure 114 includes a plurality of second maxima 132. The number of maxima in the first and/or second compensation sub-structures 113, 114 may differ from the number of illustrated first maxima 131, 132 in FIG. 2. In some embodiments, a sum of extensions 11, 12 of the first and second sub-structures along the vertical direction z is in a range from 0.5 μm to 4 μm. In some embodiments, an average doping concentration N1 along a vertical extension of the first compensation sub-structure 113 is at least five times larger than an average doping concentration N2 along a vertical extension of the second compensation sub-structure 114. According to other embodiments, the average doping concentration N1 along a vertical extension of the first compensation sub-structure 113 is at least seven times or at least ten times larger than the average doping concentration N2 along a vertical extension of the second compensation sub-structure 114.

Figure 3:
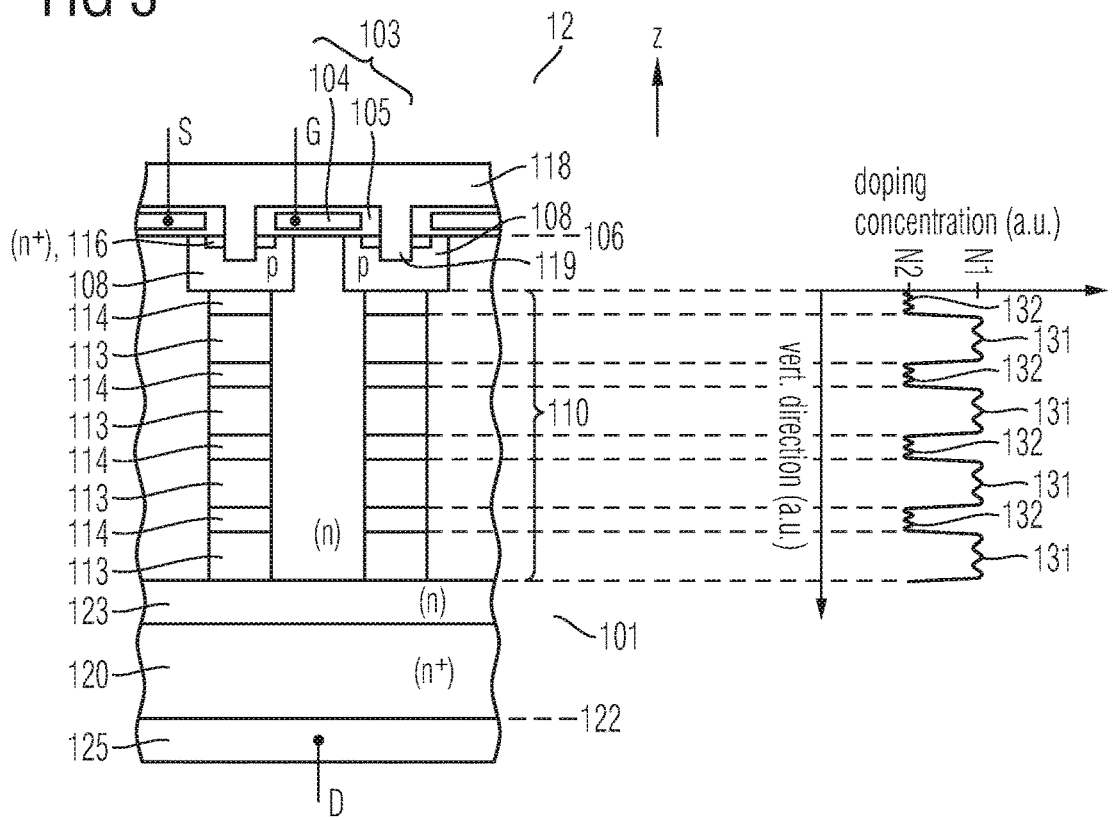
FIGS. 3 to 6 are schematic cross-sectional views of embodiments of a vertical SiC super junction semiconductor device.

Referring to the schematic cross-sectional view of the SiC semiconductor body 101 illustrated in FIG. 3, a vertical SiC super junction semiconductor device 12 includes a plurality of first and second compensation sub-structures 113, 114 alternately arranged along the vertical direction z. A doping concentration profile c in each of the first compensation sub-structures 113 includes a plurality of first maxima 131, and the doping concentration profile c in each of the second compensation sub-structure 114 includes a plurality of second maxima 132. In the embodiment illustrated in FIG. 3, the super junction structure 110 extends to the optional pedestal region 123. In some other embodiments, the super junction structure 110 may be spaced at a vertical distance to the optional pedestal region 123 or the pedestal region 123 may be even absent. A number of the first maxima 131 in the doping concentration profile c may differ between some or all of the first compensation sub-structures 113. Likewise, a number of the second maxima 132 in the doping concentration profile c may differ between some or all of the second compensation sub-structures 114. An average doping concentration N1 along a vertical extension of each of the first compensation sub-structures 113 is at least five times larger than an average doping concentration N2 along a vertical extension of each of the second compensation sub-structures 114. In addition to the first and second compensation sub-structures 113, 114 illustrated in FIG. 3, further compensation sub-structures may be provided along the vertical extension of the super junction structure, for example between some or all successive compensation sub-structures illustrated in FIG. 3. The further compensation sub-structures may include average doping concentrations different from N1, N2 and may also include one or more maxima of the doping concentration profile c. Thereby, a desired resistance profile in the p-doped compensation structure 112 may be set.

Figure 4:
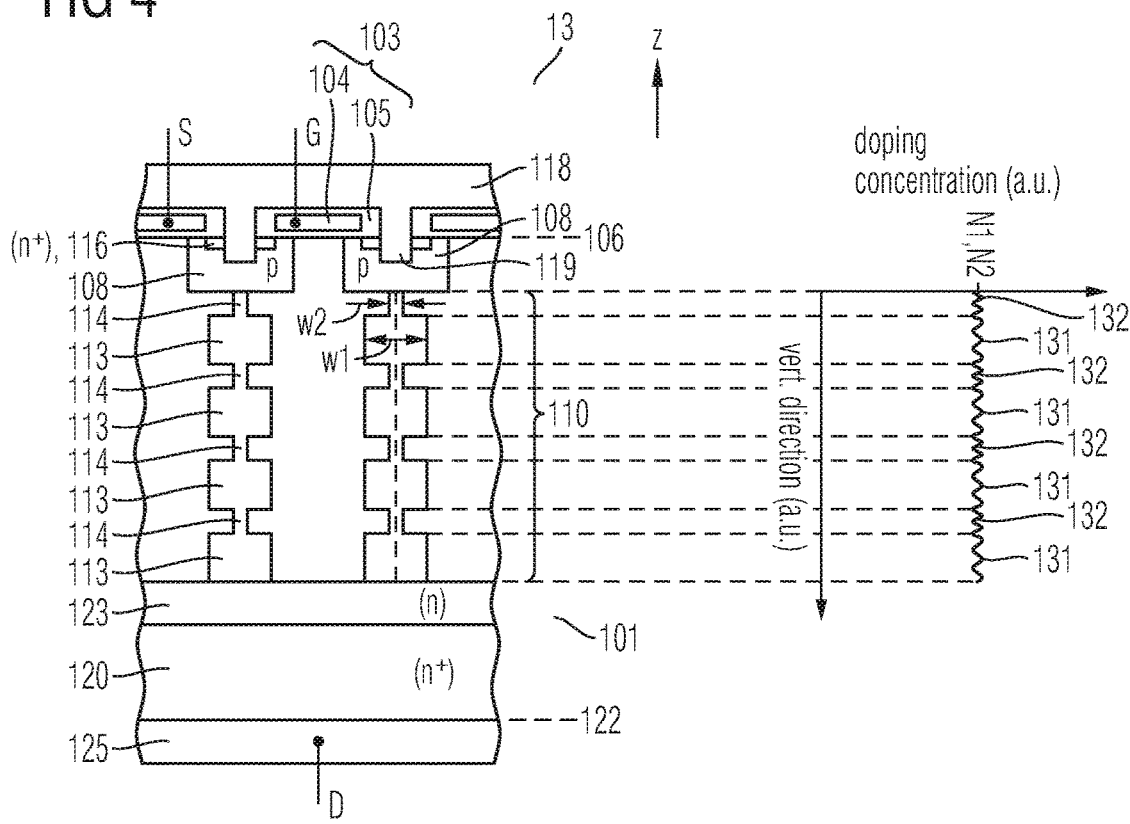

Referring to the schematic cross-sectional view of the SiC semiconductor body 101 illustrated in FIG. 4, a vertical SiC super junction semiconductor device 13 includes a plurality of first and second compensation sub-structures 113, 114 alternately arranged along the vertical direction z. A doping concentration profile c in each of the first compensation sub-structures 113 includes a plurality of first maxima 131, and the doping concentration profile c in each of the second compensation sub-structure 114 includes a plurality of second maxima 132. A width w1 of each of the first compensation sub-structures 113 is at least five times larger than a width w2 of each of the second compensation sub-structures 114. In the embodiment illustrated in FIG. 4, the super junction structure 110 extends to the optional pedestal region 123. In some other embodiments, the super junction structure 110 may be spaced at a vertical distance to the optional pedestal region 123 or the pedestal region 123 may be even absent. A number of the first maxima 131 in the doping concentration profile c may differ between some or all of the first compensation sub-structures 113. Likewise, a number of the second maxima 132 in the doping concentration profile c may differ between some or all of the second compensation sub-structures 114. An average doping concentration N1 along a vertical extension of each of the first compensation sub-structures 113 equals the average doping concentration N2 along a vertical extension of each of the second compensation sub-structures 114. In addition to the first and second compensation sub-structures 113, 114 illustrated in FIG. 4, further compensation sub-structures may be provided along the vertical extension of the super junction structure, for example between some or all successive compensation sub-structures illustrated in FIG. 4. The further compensation sub-structures may include widths different from w1, w2 and may also include one or more maxima of the doping concentration profile c. Thereby, a desired resistance profile in the p-doped compensation structure 112 may be set.

Figure 5:
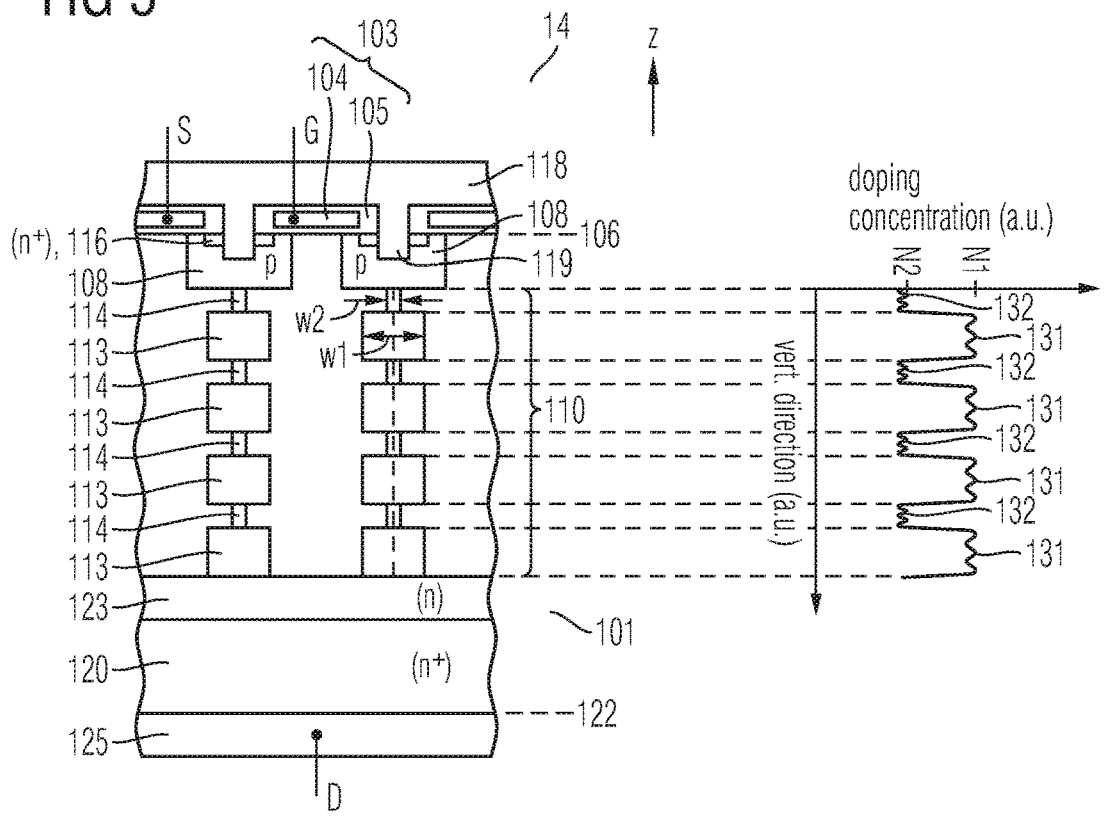

Referring to the schematic cross-sectional view of the SiC semiconductor body 101 illustrated in FIG. 5, a vertical SiC super junction semiconductor device 14 includes a plurality of first and second compensation sub-structures 113, 114 alternately arranged along the vertical direction z. The embodiment illustrated in FIG. 5 is a combination of features of the embodiments illustrated in FIGS. 3 and 4. A doping concentration profile c in each of the first compensation sub-structures 113 includes a plurality of first maxima 131, and the doping concentration profile c in each of the second compensation sub-structure 114 includes a plurality of second maxima 132. Similar to the embodiment of FIG. 3, an average doping concentration N1 along a vertical extension of each of the first compensation sub-structures 113 is at least five times, or at least seven times, or even at least 10 times larger than an average doping concentration N2 along a vertical extension of each of the second compensation sub-structures 114. Similar to the embodiment of FIG. 4, a width w1 of each of the first compensation sub-structures 113 is at least five times, or at least seven times, or even at least 10 times larger than a width w2 of each of the second compensation sub-structures 114. In the embodiment illustrated in FIG. 5, the super junction structure 110 extends to the optional pedestal region 123. In some other embodiments, the super junction structure 110 may be spaced at a vertical distance to the optional pedestal region 123 or the pedestal region 123 may be even absent. A number of the first maxima 131 in the doping concentration profile c may differ between some or all of the first compensation sub-structures 113. Likewise, a number of the second maxima 132 in the doping concentration profile c may differ between some or all of the second compensation sub-structures 114. In addition to the first and second compensation sub-structures 113, 114 illustrated in FIG. 5, further compensation sub-structures may be provided along the vertical extension of the super junction structure, for example between some or all successive compensation sub-structures illustrated in FIG. 5. The further compensation sub-structures may include widths different from w1, w2 and may also include one or more maxima of the doping concentration profile c. The further compensation sub-structures may also include average doping concentrations different from N1, N2. Thereby, a desired resistance profile in the p-doped compensation structure 112 may be set.

Figure 6:
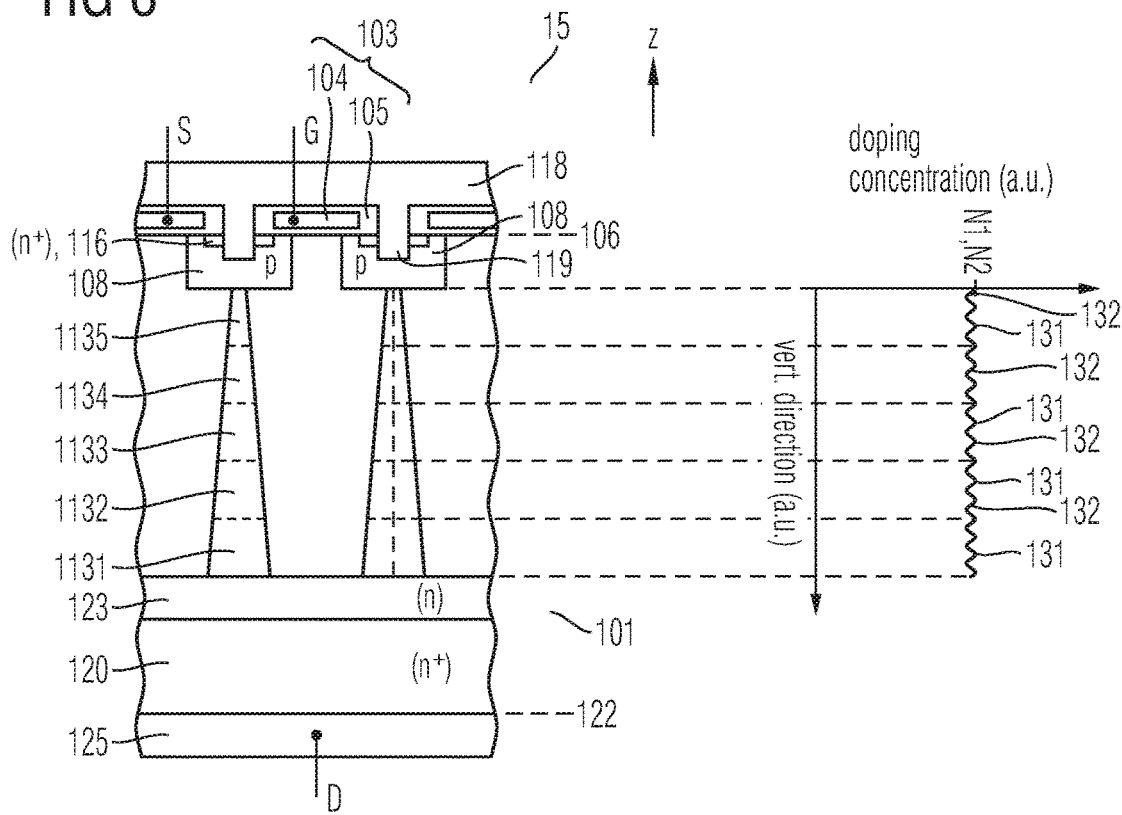

Referring to the schematic cross-sectional view of the SiC semiconductor body 101 illustrated in FIG. 6, a vertical SiC super junction semiconductor device 15 includes a plurality of compensation sub-structures 1131, 1132, 1133, 1134, 1135 alternately arranged along the vertical direction z. In the embodiment illustrated in FIG. 6, a width of the compensation sub-structures consecutively arranged along the vertical direction decreases along the vertical direction from a bottom side of the compensation structure 112 to the body region 108 at the first surface 106. In the illustrated embodiment, the width continuously decreases along the vertical direction. In some other embodiments, the width may decrease step-wise along the vertical direction or may increase continuously and step-wise in different sections along the vertical extension of the compensation structure 112.

The schematic top views of FIGS. 7A to 7E illustrate different embodiments of vertical projections of the first and second compensation sub-structures 113, 114 onto the first surface 106. The projection of the second compensation sub-structure 114 is illustrated by a dashed line.

Figure 7A:
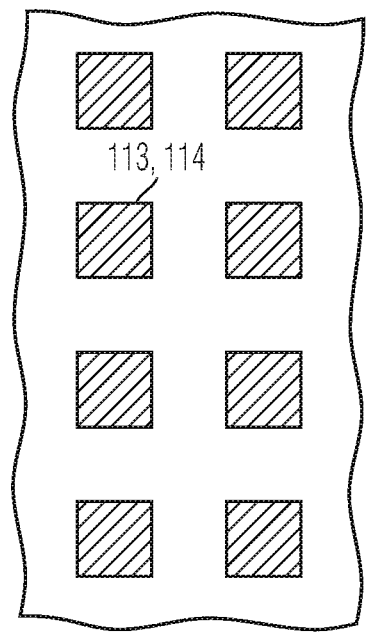
FIGS. 7A to 7E are schematic top views of layouts of compensation sub-structures projected on a surface of a SiC semiconductor body.

In the embodiment illustrated in FIG. 7A, vertical projections of the first and second compensation sub-structures 113, 114 are congruent and of an equal square pattern. An example of a cross sectional view of the embodiment of FIG. 7A is illustrated in FIG. 3.

Figure 7B:
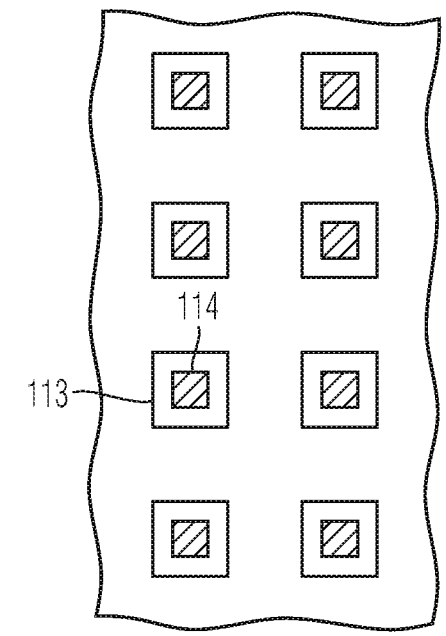

In the embodiment illustrated in FIG. 7B, a vertical projection of the first compensation sub-structure 113 to the first surface is square, and a vertical projection of the second compensation sub-structure 114 has a shape of the vertical projection of the first compensation sub-structure 113 scaled down to smaller dimensions. Examples of cross sectional views of the embodiment of FIG. 7B are illustrated in FIGS. 4, 5.

Figure 7C:
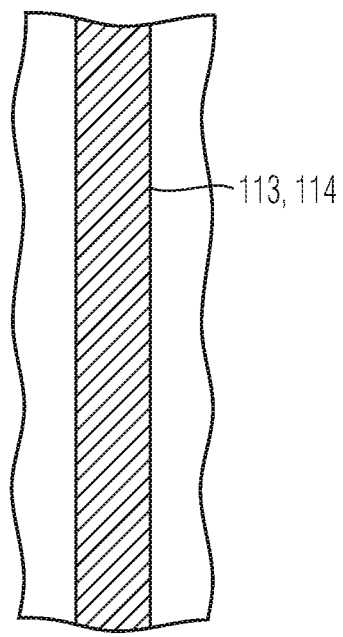

In the embodiment illustrated in FIG. 7C, vertical projections of the first and second compensation sub-structures 113, 114 are congruent and of an equal striped pattern. An example of a cross sectional view of the embodiment of FIG. 7C is illustrated in FIG. 3.

Figure 7D:
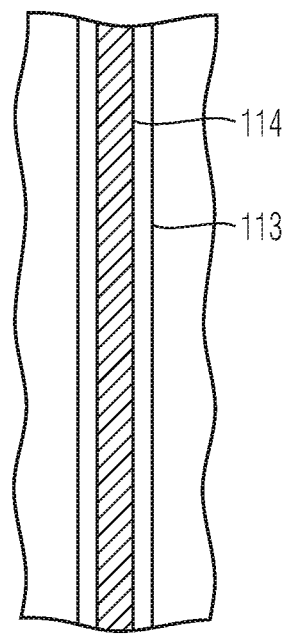

In the embodiment illustrated in FIG. 7D, a vertical projection of the first compensation sub-structure 113 to the first surface is stripe-shaped, and a vertical projection of the second compensation sub-structure 114 has a shape of the vertical projection of the first compensation sub-structure 113 scaled down to smaller dimensions. Examples of cross sectional views of the embodiment of FIG. 7D are illustrated in FIGS. 4, 5.

Figure 7E:
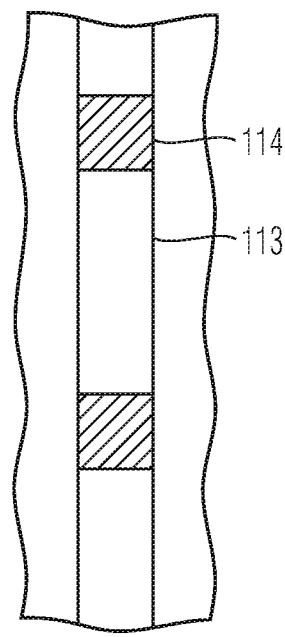

In the embodiment illustrated in FIG. 7E, a vertical projection of the first compensation sub-structure 113 to the first surface is stripe-shaped, and a vertical projection of the second compensation sub-structure 114 is of square shape. An example of a cross sectional view of the embodiment of FIG. 7E is illustrated in FIG. 3. In the embodiment illustrated in FIG. 7E, a further parameter of tuning a resistance characteristic along the vertical direction z is given by dividing an extension of the first and/or second compensation sub-structure 114 in sections. Thereby, tuning of the resistance characteristic along the vertical direction z of the compensation structure 112 becomes even more flexible.

In further embodiments, the square shaped vertical projections of the compensation sub-structures on the first surface 106 may also be rectangular, circular, polygonal or elliptical, for example.

Figure 8:
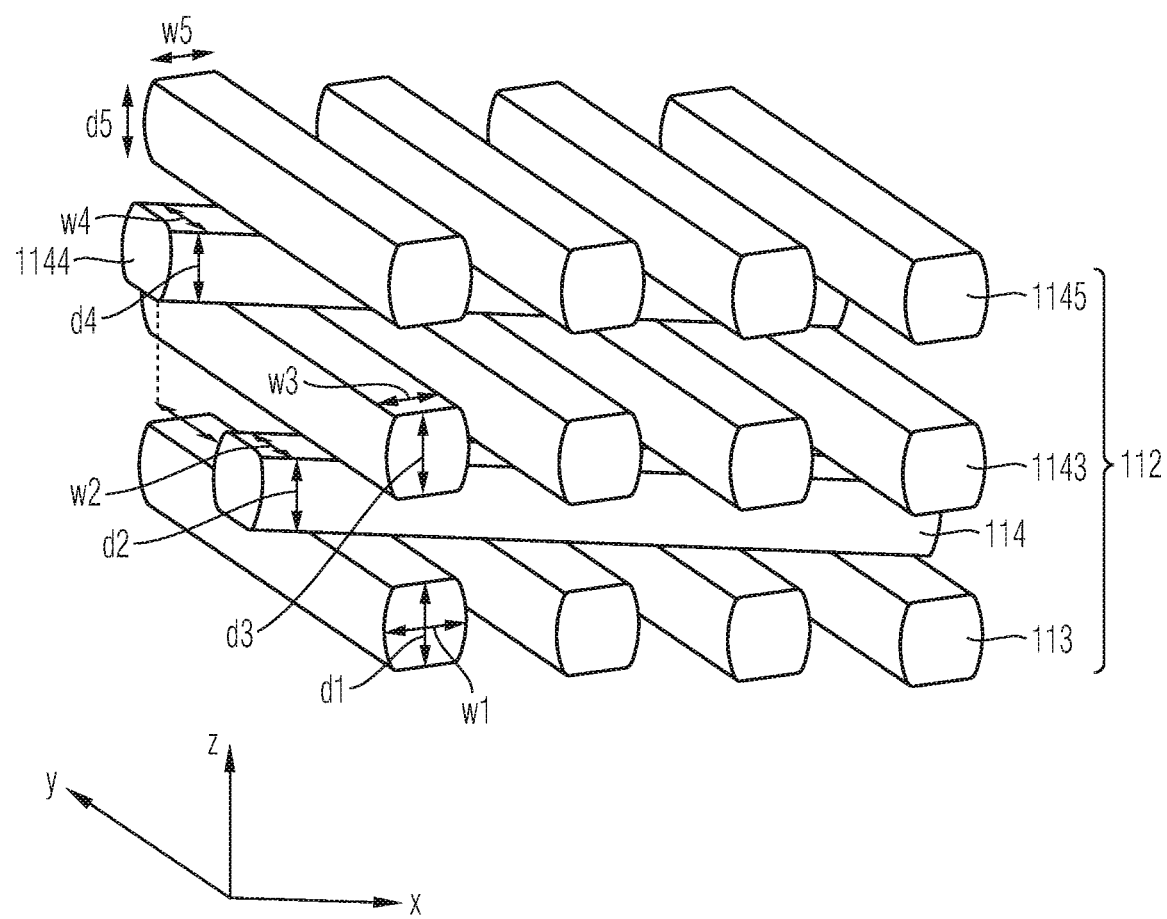
FIG. 8 is a schematic view illustrating an expansion views of compensation sub-structures in three dimensions.

The schematic view of FIG. 8 illustrates a part of the compensation structure including a plurality of first to fifth compensation sub-structures 113, 114, 1143, 1144, 1145 consecutively arranged along the vertical direction z. The first, third and fifth compensation sub-structures 113, 1143, 1145 are stripe-shaped extending along a first lateral direction y. The second and fourth compensation sub-structures 114, 1144, are also stripe-shaped extending along a second lateral direction x different from the first lateral direction y. In some embodiments, the first and second directions y, x are perpendicular to each other.

By varying one or more of lateral and vertical dimensions w1, w2, w3, w4, w5, and d1, d2, d3, d4, d5, of the first to fifth compensation sub-structures 113, 114, 1143, 1144, 1145, respectively, an average doping concentration, a pitch of parallel arrangement of the first to fifth compensation sub-structures 113, 114, 1143, 1144, 1145, respectively, an offset o of arrangement of the second and fourth compensation sub-structures 114, 1144, 1145 the resistance characteristic along the vertical direction z of the compensation structure 112 may be set flexibly.

When adjusting the dimensions of the compensation structure 112 in three dimensions as is exemplified in FIG. 8, requirements on alignment precision of different layers may be reduced when stripe-shaped compensation sub-structures stacked on each other are perpendicular. The adjustment of the compensation structure 112 in three dimensions further allows for an expansion of a load current path of electrons flowing to the drain through the drift zone. The load current path expansion is not only effected along the vertical direction, but also in a plane spanned by the lateral directions y, x in FIG. 8.

The compensation structures 12 of the vertical SiC super junction semiconductor devices 10, 11, 12, 13, 14, 15 may be manufactured by a multi-epitaxial growth technique where introduction of dopants of the compensation sub-structures in different epitaxial layers of the epitaxial layer stack grown by the multi-epitaxial growth technique differs with regard to process parameters. By way of example, masks having different mask opening layouts allow for ion implantation of dopants of compensation sub-structures of different shape as is illustrated in FIGS. 4, 5, 6, for example. By way of example, varying the implant doses allows ion implantation of dopants of compensation sub-structures of different average doping concentration as is illustrated in FIGS. 2, 3, 5 for example. Typical thicknesses of the epitaxial layers, and hence the compensation sub-structures of the epitaxial layer stack grown by the multi-epitaxial growth technique range from 0.5 µm to 15 µm and depend, inter alia, on implant energy capabilities of the ion implantation equipment. Typical widths of the compensation sub-structures are in the range of several hundreds of nanometers to several micrometers, for example. Typical doping concentrations of the compensation sub-structures are in a range from $5 \times 10^{15}$ cm$^{-3}$ to $5 \times 10^{17}$ cm$^{-3}$, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a SiC semiconductor body region comprising a body region of a first conductivity type, a drift zone of a second conductivity type, and a compensation structure of the first conductivity type,
wherein the compensation structure and a drift zone section of the drift zone form a super junction structure,
wherein the compensation structure adjoins the body region and is positioned entirely below the body region in a vertical direction perpendicular to a surface of the SiC semiconductor body,
wherein the compensation structure comprises a first compensation sub-structure and a second compensation sub-structure,
wherein the first compensation sub-structure and the second compensation sub-structure are arranged above one another in the vertical direction,
wherein a width of the compensation structure decreases starting from a bottom side of the compensation structure to the body region at the surface.

2. The semiconductor device of claim 1, wherein the width decreases continuously or decreases step-wise along the vertical direction.

3. The semiconductor device of claim 1, wherein a resistance of the second compensation sub-structure between opposite ends of the second compensation sub-structure along the vertical direction is at least five times larger than a resistance of the first compensation sub-structure between opposite ends of the first compensation sub-structure along the vertical direction.

4. The semiconductor device of claim 1, wherein an average doping concentration along a vertical extension of the second compensation sub-structure is at least five times larger than an average doping concentration along a vertical extension of the first compensation sub-structure.

5. The semiconductor device of claim 1, wherein a doping concentration profile of the first compensation sub-structure includes, between opposite ends of the first compensation sub-structure along the vertical direction, a plurality of first maxima.

6. The semiconductor device of claim 1, wherein a doping concentration profile of the second compensation sub-structure includes, between opposite ends of the second compensation sub-structure along the vertical direction, a plurality of second maxima.

7. A semiconductor device, comprising:
a SiC semiconductor body region comprising a body region of a first conductivity type, a drift zone of a second conductivity type, and a compensation structure of the first conductivity type; and
a trench gate structure extending into the SiC semiconductor body in a vertical direction perpendicular to a surface of the SiC semiconductor body,
wherein the compensation structure and a drift zone section of the drift zone form a super junction structure,
wherein the compensation structure adjoins the body region and is positioned entirely below the body region in the vertical direction,
wherein the compensation structure comprises a first compensation sub-structure and a second compensation sub-structure,
wherein the first compensation sub-structure and the second compensation sub-structure are arranged above one another in the vertical direction,
wherein a doping concentration profile of the first compensation sub-structure and/or the second compensation sub-structure includes, between opposite ends of the corresponding compensation sub-structure along the vertical direction, a plurality of first maxima.

8. The semiconductor device of claim 7, wherein a width of the compensation structure changes along the vertical direction.

9. The semiconductor device of claim 8, wherein the width of the compensation structure decreases along the vertical direction.

10. The semiconductor device of claim 8, wherein the width of the first compensation sub-structure and/or the width of the second compensation sub-structure decreases along the vertical direction.

11. The semiconductor device of claim 10, wherein the width decreases starting from a bottom side of the compensation structure to the body region at the surface.

12. The semiconductor device of claim 8, wherein the width decreases continuously or decreases step-wise along the vertical direction.

13. The semiconductor device of claim 8, wherein the width increases continuously or increases step-wise in different sections along the vertical direction.

14. The semiconductor device of claim 7, wherein a resistance of the second compensation sub-structure between opposite ends of the second compensation sub-structure along the vertical direction is at least five times larger than a resistance of the first compensation sub-structure between opposite ends of the first compensation sub-structure along the vertical direction.

15. The semiconductor device of claim 7, wherein an average doping concentration along a vertical extension of the second compensation sub-structure is at least five times larger than an average doping concentration along a vertical extension of the first compensation sub-structure.

* * * * *